(12) United States Patent
Kishore et al.

(10) Patent No.: US 7,447,372 B2
(45) Date of Patent: Nov. 4, 2008

(54) SYSTEM(S), METHOD(S), AND APPARATUS FOR DECODING EXPONENTIAL GOLOMB CODES

(75) Inventors: Chhavi Kishore, Bangalore (IN); Jagannath Sathyanarayana Shastry, Bangalore (IN)

(73) Assignee: Broadcom Corporation, Irvine, CA (US)

( * ) Notice: Subject to any disclaimer, the term of this patent is extended or adjusted under 35 U.S.C. 154(b) by 482 days.

(21) Appl. No.: 11/092,504

(22) Filed: Mar. 29, 2005

(65) Prior Publication Data

US 2006/0242544 A1    Oct. 26, 2006

(51) Int. Cl.
*G06K 9/36*    (2006.01)
*H04N 7/12*    (2006.01)
*H03M 7/40*    (2006.01)

(52) U.S. Cl. .................. 382/246; 382/233; 375/240.23; 341/67

(58) Field of Classification Search ................ 382/232, 382/233, 244, 246; 341/51, 55, 67; 375/240.23
See application file for complete search history.

(56) References Cited

U.S. PATENT DOCUMENTS

| 6,993,202 B2* | 1/2006 | Igarashi et al. .............. 382/246 |
| 7,209,059 B2* | 4/2007 | Lim et al. ..................... 341/67 |
| 2005/0275570 A1* | 12/2005 | Wang .......................... 341/65 |

OTHER PUBLICATIONS

Wakerly, John F. Digital Design: Principles and Practices 2nd Ed., Prentice Hall, 1994, pp. 323-328.*
Wu Di et al., "An Exp-Golomb encoder and decoder architecture for JVT/AVS," in Proceedings of the 5th International Conference on ASIC, vol. 2, pp. 910-913, Beijing, China, Oct. 2003.*
Lei Li et al., "On using exponential-Golomb codes and subexponential codes for system-on-a-chip test data compression", Journal of Electronic Testing: Theory and Applications, vol. 20, pp. 677-670, Dec. 2004.*

* cited by examiner

*Primary Examiner*—Colin LaRose
(74) *Attorney, Agent, or Firm*—McAndrews Held & Malloy, Ltd.

(57) ABSTRACT

Presented herein are system(s), method(s), and apparatus for decoding exponential Golomb codes. In one embodiment, there is presented a system for decoding codes having lengths (L) and information bits. The system comprises a circuit and a multiplexer. The circuit provides the information bits of the codes. The multiplexer provides values for the codes, the values for the codes being a function of $2^{trunc(L/2)}$.

12 Claims, 5 Drawing Sheets

SYSTEM(S), METHOD(S), AND APPARATUS FOR DECODING EXPONENTIAL GOLOMB CODES

RELATED APPLICATIONS

[Not Applicable]

FEDERALLY SPONSORED RESEARCH OR DEVELOPMENT

[Not Applicable]

MICROFICHE/COPYRIGHT REFERENCE

[Not Applicable]

BACKGROUND OF THE INVENTION

Video compression standards use a variety of techniques to compress video data. The techniques include both lossy and lossless compression. The lossy compression takes advantage of spatial and temporal redundancies in the video data. The lossless compression includes variable length coding, including exponential Golomb codes.

During decoding, the foregoing compressions are reversed. Part of decoding the variable length codes includes converting unsigned exponential Golomb codes to signed Golomb codes. Decoding video data is preferably done in real time. This requires large numbers of computations to performed in a short amount of time.

Further limitations and disadvantages of conventional and traditional approaches will become apparent to one of ordinary skill in the art through comparison of such systems with the present invention as set forth in the remainder of the present application with reference to the drawings.

BRIEF SUMMARY OF THE INVENTION

Presented herein are system(s), method(s), and apparatus for decoding exponential Golomb codes.

In one embodiment, there is presented a system for decoding codes having lengths (L) and information bits. The system comprises a circuit and a multiplexer. The circuit provides the information bits of the codes. The multiplexer provides values for the codes, the values for the codes being a function of $2^{trunc(L/2)}$.

In another embodiment, there is presented a decoder for decoding codes. The decoder comprises a first stage and a second stage. The first stage is operable to provide information bits for a first code having a length L1, and a value for the first code, the value for the first code being a function of $2^{trunc(L1/2)}$. The second stage is connected to the first stage, and operable to add information bits for a second code having a length L2 and a value for the second code, the value of the second code being a function of $2^{trunc(L2/2)}$, while the first stage provides information bits and the value for the first code.

In another embodiment, there is presented a method for decoding a code having a length L. The method comprises providing information bits for the code; providing a value for the code, wherein the value for the code is a function of $2^{Trunc(L/2)}$; and adding the information bits for the code to the value for the code.

In another embodiment, there is presented a multiplexer for providing a selection. The multiplexer comprises a plurality of inputs, another input, and an output. The plurality of inputs receive data that is a function of $2^{trunc(L/2)}$, where L is variable. The another input receives a control signal providing an input variable. The output provides a particular one of the inputs, wherein the particular one of the inputs is the input receiving data that is the function for the input variable.

These and other advantages and novel features of the present invention, as well as details of an illustrated embodiment thereof, will be more fully understood from the following description and drawings.

DETAILED DESCRIPTION OF THE INVENTION

Figure 1:
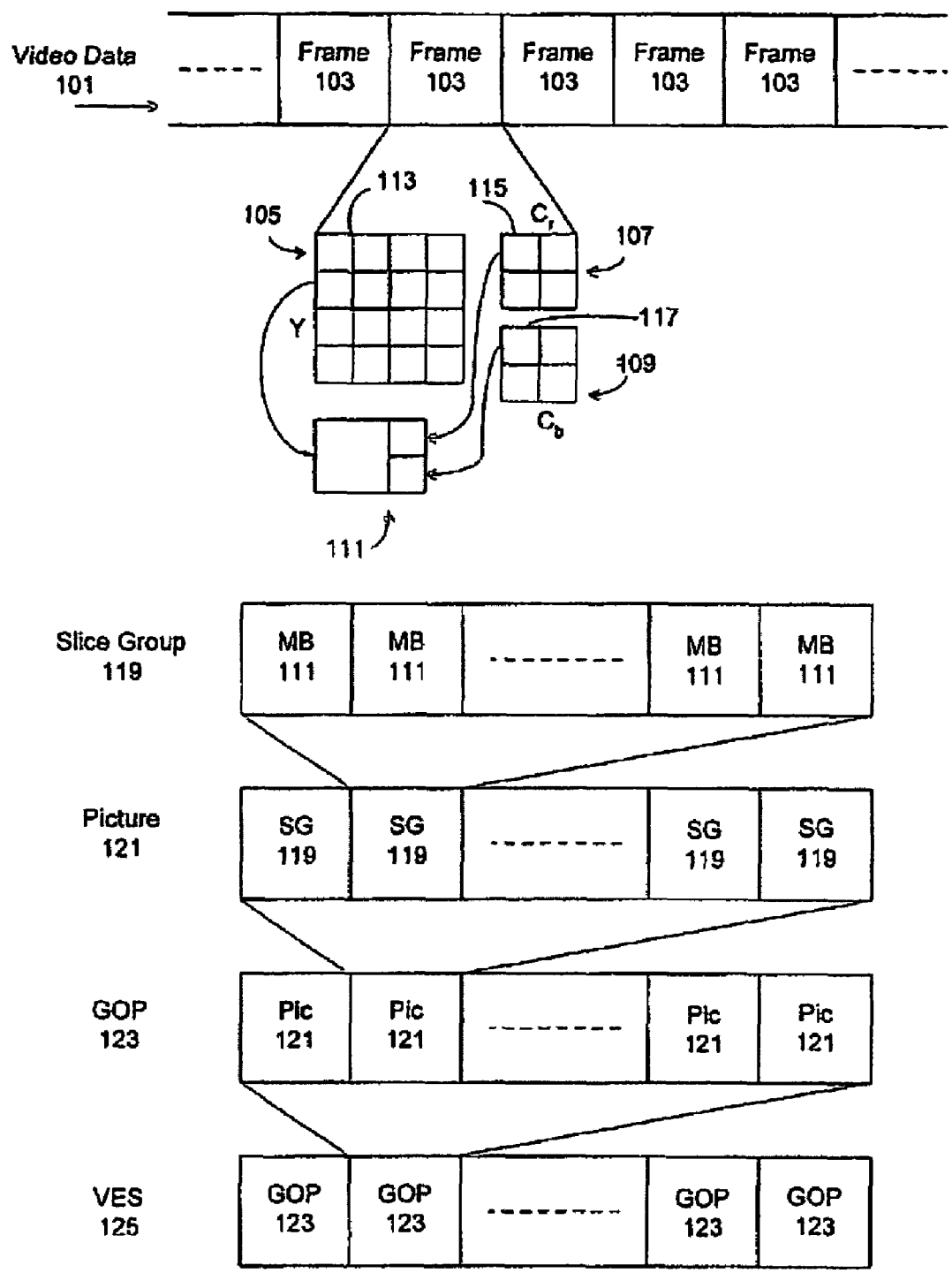
FIG. 1 is a block diagram describing the coding of exemplary video data.

FIG. 1 illustrates a block diagram of an exemplary Moving Picture Experts Group (MPEG) encoding process of video data 101, in accordance with an embodiment of the present invention. The video data 101 comprises a series of frames 103. Each frame 103 comprises two-dimensional grids of luminance Y, 105, chrominance red Cr, 107, and chrominance blue $C_b$, 109, pixels. The two-dimensional grids are divided into 8×8 blocks, where a group of four blocks or a 16×16 block 113 of luminance pixels Y is associated with a block 115 of chrominance red $C_r$, and a block 117 of chrominance blue $C_b$ pixels. The block 113 of luminance pixels Y, along with its corresponding block 115 of chrominance red pixels $C_r$, and block 117 of chrominance blue pixels $C_b$ form a data structure known as a macroblock 111. The macroblock 111 also includes additional parameters, including motion vectors, explained hereinafter. Each macroblock 111 represents image data in a 16×16 block area of the image.

The data in the macroblocks 111 is compressed in accordance with algorithms that take advantage of temporal and spatial redundancies. For example, in a motion picture, neighboring frames 103 usually have many similarities. Motion causes an increase in the differences between frames, the difference being between corresponding pixels of the frames, which necessitate utilizing large values for the transformation from one frame to another. The differences between the frames may be reduced using motion compensation, such that the transformation from frame to frame is minimized. The idea of motion compensation is based on the fact that when an object moves across a screen, the object may appear in different positions in different frames, but the object itself does not change substantially in appearance, in the sense that the pixels comprising the object have very close values, if not the same, regardless of their position within the frame. Measuring and recording the motion as a vector can reduce the picture differences. The vector can be used during decoding to shift a macroblock 111 of one frame to the appropriate part of another frame, thus creating movement of the object. Hence, instead of encoding the new value for each pixel, a block of pixels can be grouped, and the motion vector, which determines the position of that block of pixels in another frame, is encoded.

Accordingly, most of the macroblocks 111 are compared to portions of other frames 103 (reference frames). When an appropriate (most similar, i.e. containing the same object(s)) portion of a reference frame 103 is found, the differences between the portion of the reference frame 103 and the macroblock 111 are encoded. The location of the portion in the reference frame 103 is recorded as a motion vector. The encoded difference and the motion vector form part of the data structure encoding the macroblock 111. In the MPEG-2 standard, the macroblocks 111 from one frame 103 (a predicted frame) are limited to prediction from portions of no more than two reference frames 103. It is noted that frames 103 used as a reference frame for a predicted frame 103 can be a predicted frame 103 from another reference frame 103.

The macroblocks 111 representing a frame are grouped into different slice groups 119. The slice group 119 includes the macroblocks 111, as well as additional parameters describing the slice group. Each of the slice groups 119 forming the frame form the data portion of a picture structure 121. The picture 121 includes the slice groups 119 as well as additional parameters that further define the picture 121.

The pictures are then grouped together as a group of pictures (GOP) 123. The GOP 123 also includes additional parameters further describing the GOP. Groups of pictures 123 are then stored, forming what is known as a video elementary stream (VES) 125. The VES 125 is then packetized to form a packetized elementary sequence.

The video elementary stream 125 is also encoded using lossless compression techniques. The lossless compression techniques include variable length coding, including exponential Golomb coding, to code the symbols of the video elementary stream 125.

Figure 2:
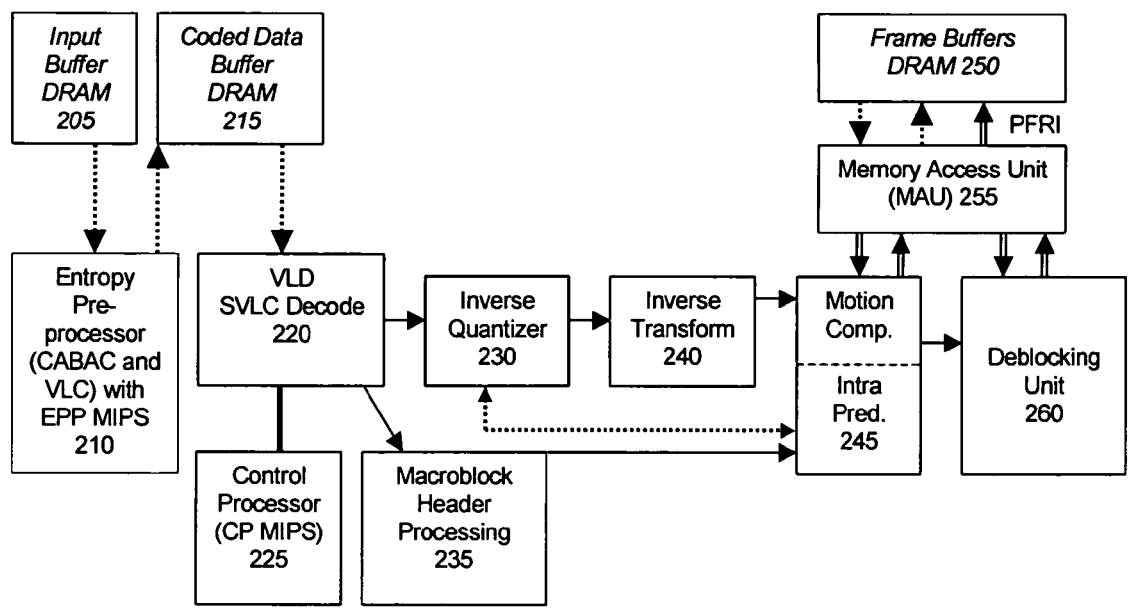
FIG. 2 is a block diagram of an exemplary video decoder in accordance with an embodiment of the present invention.

Referring now to FIG. 2, there is illustrated a block diagram describing an exemplary video decoder system 200 in accordance with an embodiment of the present invention. The video decoder 200 comprises an input buffer DRAM 205, an entropy pre-processor 210, a coded data buffer DRAM 215, a variable length code decoder 220, a control processor 225, an inverse quantizer 230, a macroblock header processor 235, an inverse transformer 240, a motion compensator and intrapicture predictor 245, frame buffers 250, a memory access unit 255, and a deblocker 260.

The input buffer DRAM 205, entropy pre-processor 210, coded data buffer DRAM 215, and variable length code decoder 220 together decode the variable length coding associated with the video data, resulting in pictures 100 represented by macroblocks 120.

The inverse quantizer 230 inverse quantizes the macroblocks 120, resulting in sets of frequency coefficients. The macroblock header processor 235 examines side information, such as parameters that are encoded with the macroblocks 120. The inverse transformer 240 transforms the frequency coefficients, thereby resulting in the prediction error. The motion compensator and intrapicture predictor 245 decodes the macroblock 120 pixels from the prediction error. The decoded macroblocks 120 are stored in frame buffers 250 using the memory access unit 255. A deblocker 260 is used to deblock adjacent macroblocks 120.

The variable length decoder 220 decodes the exponential Golomb codes. At table of unsigned exponential Golomb code words is written in the following form:

|   |   |   |   | 1 |       |       |       |       |
|---|---|---|---|---|-------|-------|-------|-------|
|   |   |   | 0 | 1 | $x_0$ |       |       |       |
|   |   | 0 | 0 | 1 | $x_1$ | $x_0$ |       |       |
|   | 0 | 0 | 0 | 1 | $x_2$ | $x_1$ | $x_0$ |       |
| 0 | 0 | 0 | 0 | 1 | $x_3$ | $x_2$ | $x_1$ | $x_0$ | where $x_n$ takes values 0 or 1.

The leading zeros are a prefix. The bits after the leading 1 are referred to as the information bits. Where L is the length in bits of the Golomb codes word, and where n−1 is the number of information bits, L=2n−1.

An exponential Golomb may be decoded to obtain an unsigned value (Fixed Length Code) using the following equation:

$$FLC=2^{Trunc(L/2)}+INFO-1$$

where the trunc ( ) function removes any fractional portion of the argument;
INFO=the information bits (INFO=0), when L=1.

Figure 3:
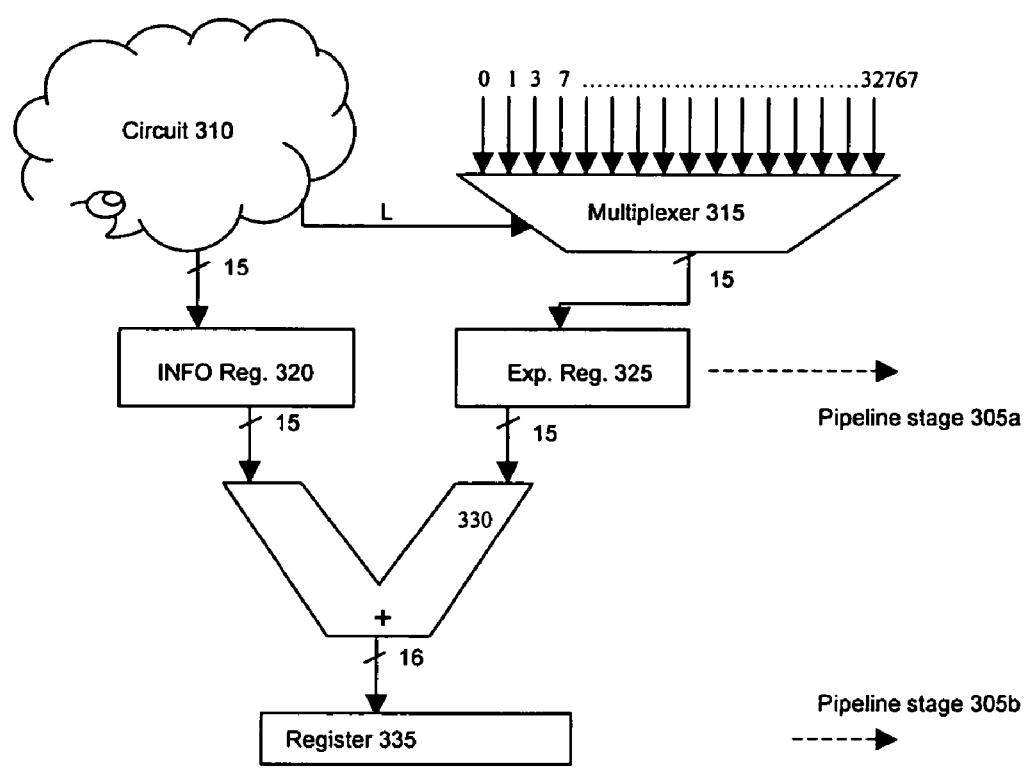
FIG. 3 is a block diagram of a variable length code decoder in accordance with an embodiment of the present invention.

Referring now to FIG. 3, a block diagram of an exemplary variable length code decoder 220. The variable length code decoder 220 comprises a first stage 305a and a second stage 305b. The first stage 305a comprises a circuit 310, a multiplexer 315, an information bit register 320, and an exponent register 325. The second stage 305b comprises an adder 330 and an output register 335.

The circuit 310 receives the exponential Golomb code and outputs the information bits to the information register 320, and the length L of the exponential Golomb code to the multiplexer 315. The circuit 310 can comprise logic circuits.

The multiplexer 315 provides the $2^{trunc(L/2)}-1$ portion of the conversion equation, now referred to as the exponential portion. The multiplexer 315 receives the values $2^n-1$, where n=1, 2, ... 15. The values are spatially arranged in ascending order. The multiplexer 315 selects a particular one of the values, based on the length L received from the circuit 310. The multiplexer 315 selects the value in the position, (L+1)/2, where position n corresponds receives $2^n-1$, and provides the selected value to the exponent register 325.

The adder 330 adds the contents of the information register 320 and the contents of the exponent register 325. The adder 330 writes the sum to the output register 335. The contents of the output register 335 are the decoded fixed length code value for the unsigned exponential Golomb code.

According to the certain aspects of the present invention, the variable length code decoder 220 can decode unsigned exponential Golomb codes in pipeline fashion. While the first stage provides the information bits INFO to the information register 320, and the exponential portion to the exponent register 325 for a first unsigned exponential Golomb code, in the second stage 305b, the adder 330 can provide the sum of the information bits and exponential portion for a second unsigned exponential Golomb code.

Figure 4:
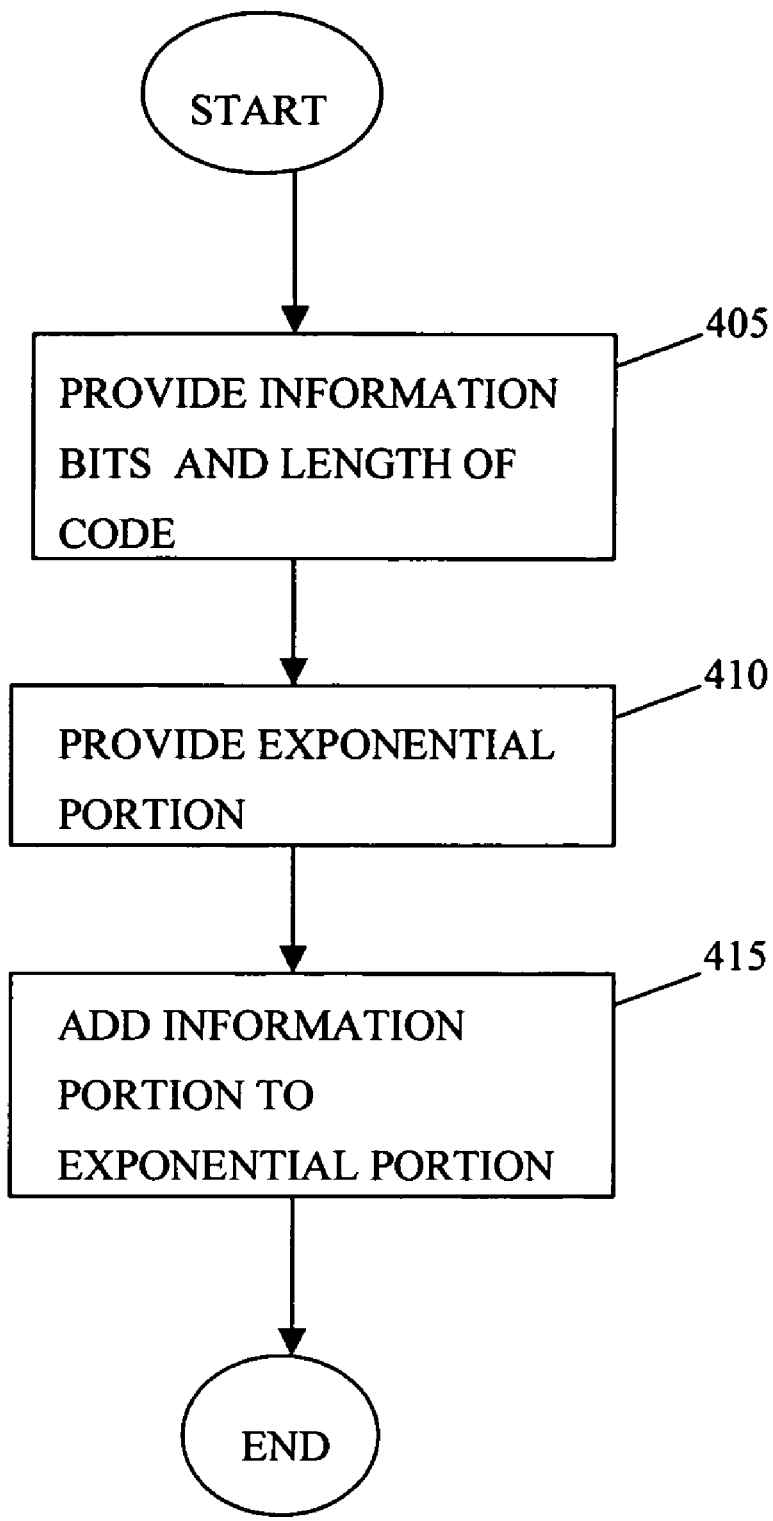
FIG. 4 is a flow diagram for decoding exponential golomb codes in accordance with an embodiment of the present invention.

Referring now to FIG. 4, there is illustrated a flow diagram for converting unsigned exponential Golomb codes in accordance with an embodiment of the present invention. At 405, the circuit 310 provides the information bits to the information register 320 and the length L to the multiplexer 315. At 410, the multiplexer 315 provides the exponential portion to the exponential register 325.

At 415, the adder 330 adds the information portion from the information register 320 to the exponential portion from the exponential register 325, providing the sum to the output register 335.

Figure 5:
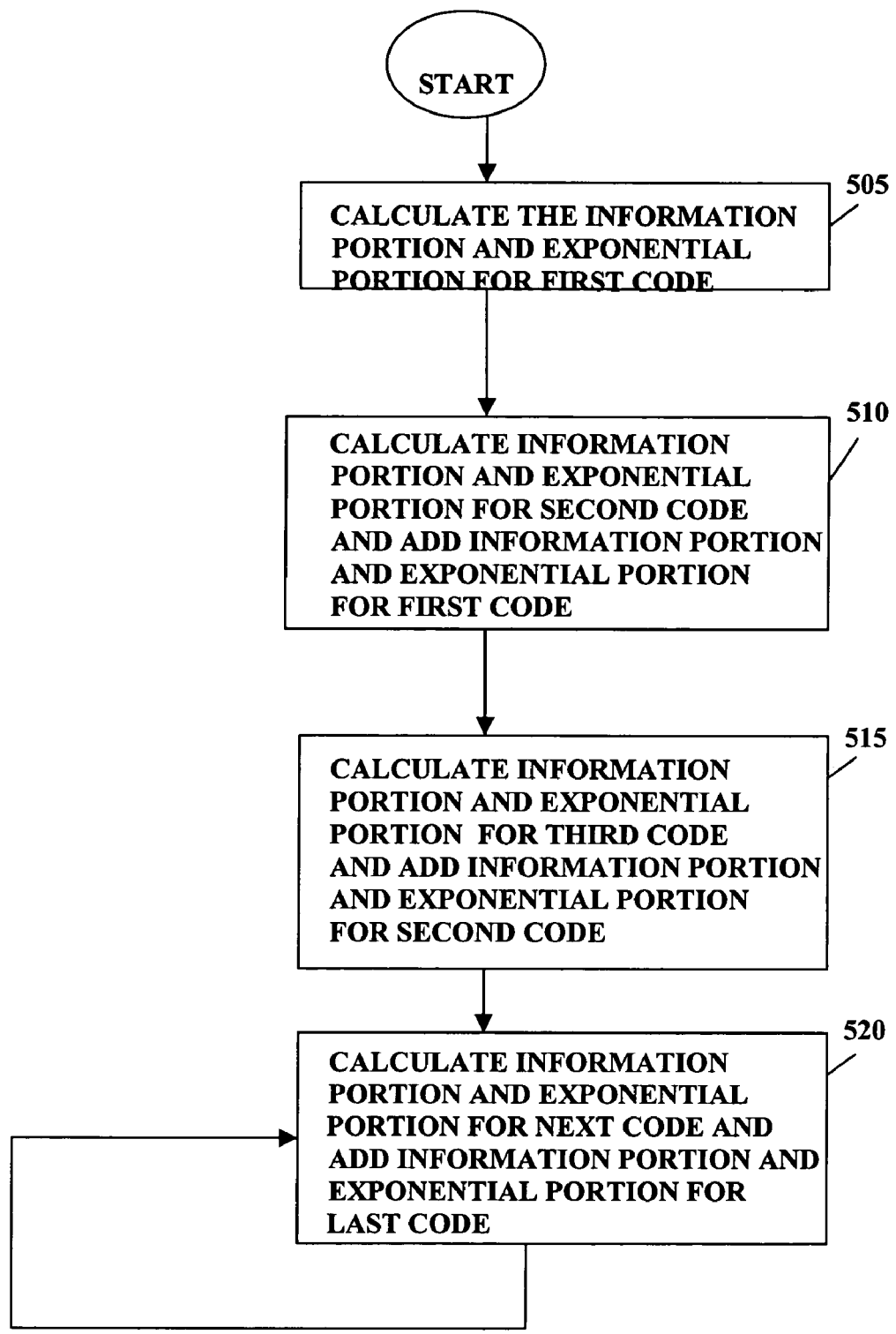
FIG. 5 is a flow diagram for decoding multiple exponential golomb codes in accordance with an embodiment of the present invention.

Referring now to FIG. 5, there is illustrated a flow diagram for decoding unsigned exponential Golomb codes in accordance with an embodiment of the present invention. At 505, the first stage 305a calculates the information portion and the exponential portion for a first exponential Golomb code.

At 510, the first stage 305a calculates the information portion and the exponential portion for a second unsigned exponential Golomb code, and the second stage 305b adds the information portion and the exponential portion for the first exponential Golomb code, resulting in the decoded fixed length code.

At 515, the first stage 305a calculates the information portion and the exponential portion for a third unsigned exponential Golomb code, and the second stage 305b adds the information portion and the exponential portion for the second exponential Golomb code, resulting in the decoded fixed length code.

At 520, the first stage 305a calculates the information portion and the exponential portion for the next exponential Golomb code, and the second stage 305b adds the information portion and the exponential portion calculated for the last code by the first stage, resulting in the decoded fixed length code. The foregoing, 520 can be repeated any number of times.

The embodiments described herein may be implemented as a board level product, as a single chip, application specific integrated circuit (ASIC), or with varying levels of the decoder system integrated with other portions of the system as separate components. The degree of integration of the decoder system will primarily be determined by the speed and cost considerations. Because of the sophisticated nature of modern processor, it is possible to utilize a commercially available processor, which may be implemented external to an ASIC implementation. If the processor is available as an ASIC core or logic block, then the commercially available processor can be implemented as part of an ASIC device wherein certain functions can be implemented in firmware. Alternatively, the functions can be implemented as hardware accelerator units controlled by the processor. In one representative embodiment, the encoder or decoder can be implemented as a single integrated circuit (i.e., a single chip design).

While the present invention has been described with reference to certain embodiments, it will be understood by those skilled in the art that various changes may be made and equivalents may be substituted without departing from the scope of the present invention. In addition, many modifications may be made to adapt a particular situation or material to the teachings of the present invention without departing from its scope. For example, although the embodiments have been described with a particular emphasis on the MPEG-2 standard, the teachings of the present invention can be applied to many other standards without departing from it scope. Therefore, it is intended that the present invention not be limited to the particular embodiment disclosed, but that the present invention will include all embodiments falling within the scope of the appended claims.

The invention claimed is:

1. A system for decoding codes having lengths (L) and information bits, said system comprising:
   a circuit for providing the information bits of the codes;
   a multiplexer for providing values for the codes, the values for the codes being a function of $2^{trunc(L/2)}$; and
   an adder for adding the information bits to the values provided by the multiplexer.

2. The system of claim 1, wherein the values are $2^{trunc(L/2)}-1$.

3. The system of claim 1, wherein the circuit provides the multiplexer with other values, the other values being a function of the length L.

4. The system of claim 1, further comprising:
   a first register for providing the information bits to the adder; and
   a second register for providing the value from the multiplexer to the adder.

5. The system of claim 1, wherein the multiplexer provides a value for a first code, while the adder adds information bits for a second code to a value provided by the multiplexer for a second code.

6. A decoder for decoding codes, said decoder comprising:
   a first stage operable to provide information bits for a first code having a length L1 and a value for the first code, the value for the first code being a function of $2^{trunc(L1/2)}$; and
   a second stage connected to the first stage, the second stage operable to add information bits for a second code having a length L2 and a value for the second code, the value of the second code being a function of $2^{trunc(L2/2)}$, while the first stage provides information bits and the value for the first code.

7. The decoder of claim 6, wherein the first stage further comprises:
   a circuit operable to provide the information bits for the first code; and
   a multiplexer connected to the circuit, the multiplexer operable to provide the value for the first code.

8. The decoder of claim 7, wherein the multiplexer is operably connected to the circuit to receive another value for the first code, the another value being a function of L1.

9. The decoder of claim 7, further comprising:
   a first register operably connected to the circuit to receive the information bits for the first code; and
   a second register operably connected to the multiplexer to receive the value for the first code.

10. The decoder of claim 9, wherein:
    the first register is operably connected to the second stage to provide the second stage with the information bits for the first code; and
    the second register is operably connected to the second stage to provide the second stage to provide the value for the first code.

11. A method for decoding a code having a length L, said method comprising:
    providing information bits for the code;
    providing a value for the code, wherein the value for the code is a function of $2^{Trunc(L/2)}$; and
    adding the information bits for the code to the value for the code.

12. The method of claim 11, further comprising:
    providing information bits for another code, while adding the information bits for the code to the value for the code; and
    providing the value for the another code while adding the information bits for the code to the value for the code.

* * * * *